(12) United States Patent
Wu et al.

(10) Patent No.: US 8,278,756 B2
(45) Date of Patent: *Oct. 2, 2012

(54) SINGLE CHIP SEMICONDUCTOR COATING STRUCTURE AND MANUFACTURING METHOD THEREOF

(75) Inventors: Liang-Chieh Wu, Tucheng (TW); Cheng-Yi Wang, Shulin (TW)

(73) Assignee: Inpaq Technology Co., Ltd., Miaoli County (TW)

( * ) Notice: Subject to any disclaimer, the term of this patent is extended or adjusted under 35 U.S.C. 154(b) by 200 days.

This patent is subject to a terminal disclaimer.

(21) Appl. No.: 12/711,712

(22) Filed: Feb. 24, 2010

(65) Prior Publication Data

US 2011/0204516 A1    Aug. 25, 2011

(51) Int. Cl.
  *H01L 23/52* (2006.01)
(52) U.S. Cl. ......... 257/741; 257/686; 257/687; 257/688
(58) Field of Classification Search .................. 257/741, 257/686–688
See application file for complete search history.

(56) References Cited

U.S. PATENT DOCUMENTS

| | | | | |
|---|---|---|---|---|
| 4,358,784 A * | 11/1982 | Wislocky et al. | ............. | 257/741 |
| 5,399,898 A * | 3/1995 | Rostoker | ....................... | 257/499 |
| 5,608,262 A * | 3/1997 | Degani et al. | .................. | 257/723 |
| 5,766,972 A * | 6/1998 | Takahashi et al. | ............. | 438/127 |
| 5,969,426 A * | 10/1999 | Baba et al. | ..................... | 257/778 |
| 6,916,719 B1 * | 7/2005 | Knight et al. | ................. | 438/381 |
| 7,575,955 B2 * | 8/2009 | Attarwala | ...................... | 438/118 |
| 7,713,785 B1 * | 5/2010 | Flint, Jr. | ......................... | 438/113 |
| 7,838,977 B2 * | 11/2010 | Sun et al. | ...................... | 257/686 |
| 7,884,462 B2 * | 2/2011 | Wu et al. | ....................... | 257/690 |
| 2005/0236708 A1 * | 10/2005 | Farnworth et al. | ............. | 257/723 |
| 2006/0211296 A1 * | 9/2006 | Dittmann | ...................... | 439/495 |
| 2007/0080360 A1 * | 4/2007 | Mirsky et al. | ................... | 257/99 |
| 2007/0164409 A1 * | 7/2007 | Holland | ........................ | 257/678 |
| 2007/0257373 A1 * | 11/2007 | Akram et al. | ................. | 257/774 |
| 2007/0290311 A1 * | 12/2007 | Hauenstein | ................... | 257/685 |
| 2008/0023807 A1 * | 1/2008 | Noquil et al. | ................. | 257/675 |
| 2008/0088003 A1 * | 4/2008 | Wehrly, Jr. | ..................... | 257/688 |
| 2008/0246126 A1 * | 10/2008 | Bowles et al. | ................ | 257/659 |
| 2009/0072395 A1 * | 3/2009 | Iguchi et al. | .................. | 257/737 |
| 2010/0078798 A1 * | 4/2010 | Wu et al. | ....................... | 257/690 |
| 2010/0176498 A1 * | 7/2010 | Lee et al. | ...................... | 257/675 |
| 2011/0095411 A1 * | 4/2011 | Herbsommer et al. | ........ | 257/676 |
| 2011/0133302 A1 * | 6/2011 | Sulfridge | ....................... | 257/466 |
| 2011/0250721 A1 * | 10/2011 | Bowles et al. | ................ | 438/107 |
| 2011/0272806 A1 * | 11/2011 | Akram et al. | ................. | 257/738 |

* cited by examiner

*Primary Examiner* — Eugene Lee
*Assistant Examiner* — Mohammed Shamsuzzaman
(74) *Attorney, Agent, or Firm* — Houtterman Law LLC

(57) ABSTRACT

A manufacturing method of a single chip semiconductor coating structure includes following steps. Step 1 is providing a single chip semiconductor which has a plurality of surfaces, and two opposite surfaces selected from the plurality of surfaces are manufacturing surfaces and have a conductive area with a pad thereon, respectively. Step 2 is providing a tool to cover one of the conductive areas with the pad. Step 3 is providing a coating step to form an insulating layer on the single chip semiconductor. Step 4 is providing a removing step to remove the insulating layer for exposing the covered conductive area and the pad. Step 5 is forming two electrodes and each of the two electrodes covers the conductive area with the pad.

7 Claims, 4 Drawing Sheets

SINGLE CHIP SEMICONDUCTOR COATING STRUCTURE AND MANUFACTURING METHOD THEREOF

BACKGROUND OF THE INVENTION

1. Field of the Invention

The present invention relates to a single chip semiconductor coating structure and the manufacturing method thereof, in particular to a coating structure and the manufacturing method thereof for manufacturing a single chip semiconductor with an isolating layer, electrodes and connecting layers.

2. Description of Related Art

Packages for semiconductor devices are provided for functions of protection, heat-dissipation and electrical connections. New-developed packaging methods are applied in high performance device, such as BGA (ball grid array), FC (flip-chip), and MCM (multi chip module). On the other hand, the traditional packaging structure of lead-frame which includes die-bonding, wire-bonding, molding and ink-marking steps is widely used in semiconductor package industries.

However, the traditional packaging structure of lead-frame has drawbacks. For example, the packaging methods for manufacturing the lead-frame structure have complex steps so that the traditional packaging method has time-consuming issue and the manufacturing cost of the traditional packaging structure is increased. For solving the issues of the traditional packaging structure, a method for manufacturing devices having an isolating structure and a weldable structure is provided so that the manufactured device can be directly mounted on the PCB. Furthermore, the method can be applied in various devices, and the reliability and industry level of the packaging structure of semiconductors can be highly improved.

Therefore, in view of these difficulties, the inventor has developed ways to overcome these difficulties to yield dependable product with reliable results in production; the present invention addresses these difficulties and allows reliable production at high speed and overcomes the above problems.

SUMMARY OF THE INVENTION

The primary objective of the present invention is to provide a single chip semiconductor coating structure and the manufacturing method thereof. The insulating layer of the coating structure is coated on the non-conductive surfaces of the device, and the electrode and the connecting layer with weldability are coated on the two opposite conductive surfaces. Therefore, the single chip semiconductor is protected by the coating structure and the product of the manufacturing method of the present invention can be directly welded on PCB.

To achieve the above-mentioned objective, the present invention provides a manufacturing method of a single chip semiconductor coating structure. The manufacturing method of a single chip semiconductor coating structure includes steps of: providing a single chip semiconductor, wherein the single chip semiconductor has a plurality of surfaces, two opposite surfaces selected from the plurality of surfaces are manufacturing surfaces and have a conductive area with a pad thereon, respectively; providing a tool to cover one of the conductive areas with the pad; providing a coating step to form an insulating layer on the single chip semiconductor; providing a removing step to remove the insulating layer for exposing the covered conductive area and the pad; and forming two electrodes, wherein each of the two electrodes covers the conductive area with the pad.

The present invention further provides a single chip semiconductor coating structure. The single chip semiconductor coating structure has a single chip semiconductor which has a plurality of surfaces, wherein two opposite surfaces selected from the plurality of surfaces are manufacturing surfaces and have a conductive area with a pad thereon, respectively; an insulating layer which is coated on the rest surfaces of the plurality of surfaces; and two electrodes. Each of the two electrodes is formed on the conductive area with the pad.

The manufacturing method of the present invention can be applied for devices of various types and structures. In one embodiment, the pads are formed on the top and the bottom surfaces which are manufacturing surfaces of the silicon wafer. The top and the bottom surfaces are processed or will be processed by semiconductor-manufacturing method, such as photolithography, thin-film deposition, etching, doping and so on. On the other hand, the positions of the pads are aligned to each other, for example, the pads are disposed on the center of the top surface and the center of the bottom surface, respectively. In another embodiment, the positions of the pads are misaligned to each other, for example, one pad is disposed on the right edge of the top surface and the other pad is disposed on the left edge of the bottom surface, respectively. Accordingly, the insulating layer is formed on the non-conductive surfaces (i.e., the surfaces without the pad), and the electrode and the connecting layer with weldability are formed on the conductive surfaces (i.e., the surfaces with the pad) so that the ingle chip semiconductor can be directly mounted on PCB by welding. Therefore, the issues of the back-end manufacturing steps are avoided.

In order to further understand the techniques, means, and effects the present invention takes for achieving the prescribed objectives, the following detailed descriptions and appended drawings are hereby referred, such that, through which, the purposes, features, and aspects of the present invention can be thoroughly and concretely appreciated; however, the appended drawings are (this is a diminutive term in this sense—not good for these circumstances) provided solely for reference, demonstration, clarity and illustration, without intent that they will be used for limiting the present invention.

DETAILED DESCRIPTION OF THE PREFERRED EMBODIMENTS

Figure 1:
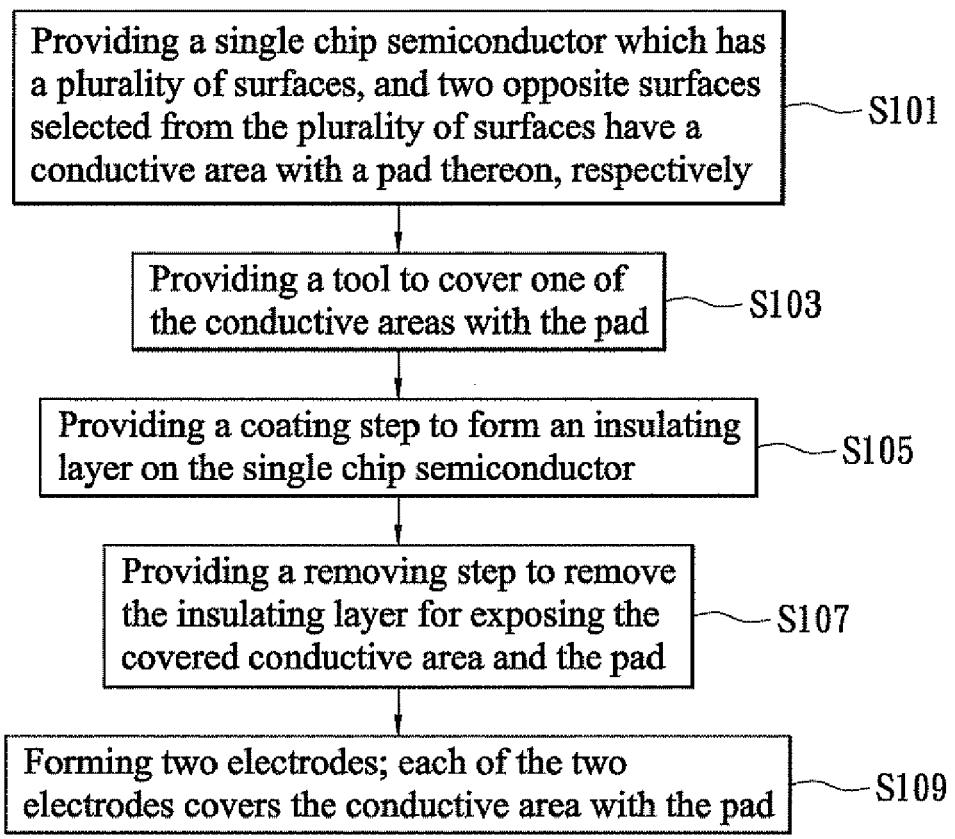
FIG. 1 shows the flow-chart of the manufacturing method according to the present invention.
Figure 1A:
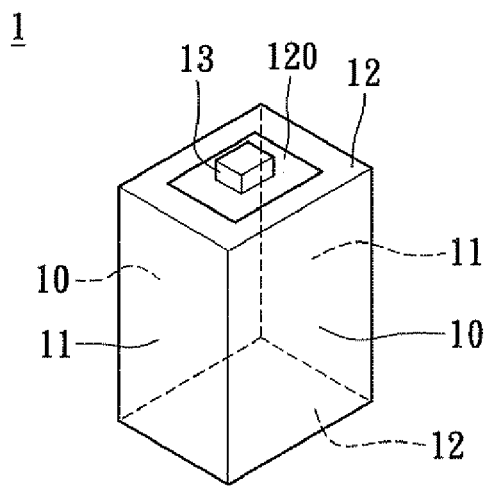
FIG. 1A is a structural diagram of the single chip semiconductor coating structure according to the present invention.
Figure 2:
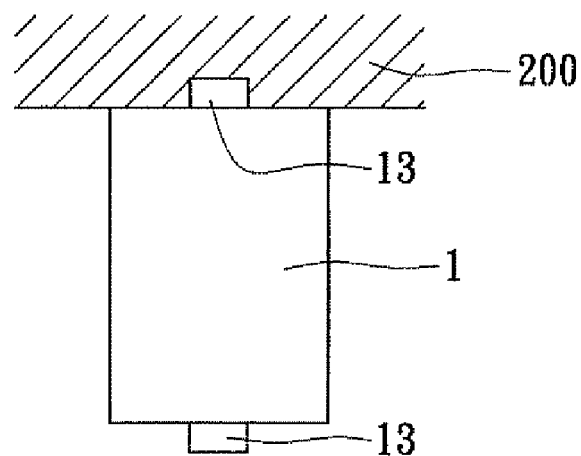
FIG. 2 is a structural diagram showing the single chip semiconductor assembled on the tool according to the present invention.
Figure 2A:
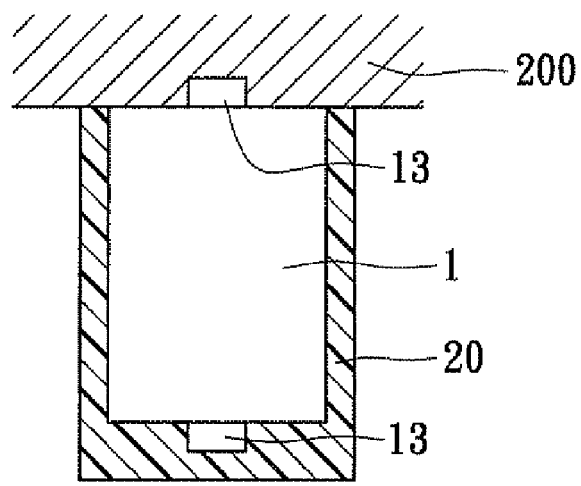
FIG. 2A is a structural diagram showing the coating step on the single chip semiconductor according to the present invention.
Figure 2B:
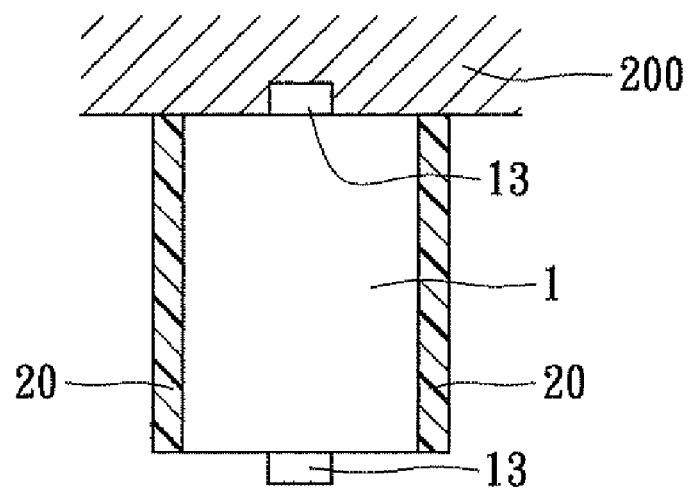
FIG. 2B is a structural diagram showing the removing step according to the present invention.
Figure 2C:
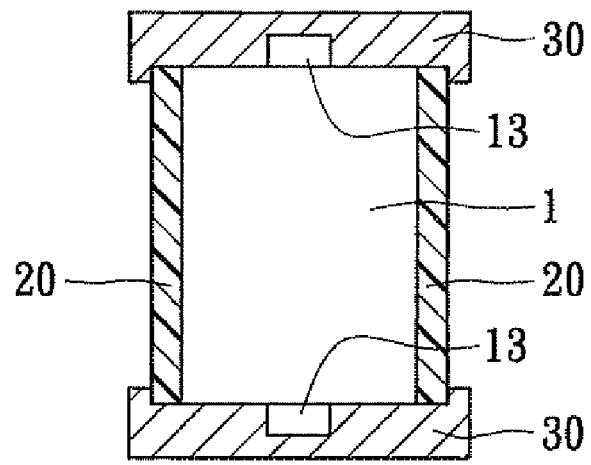
FIG. 2C is a structural diagram showing the step of forming electrode on the single chip semiconductor according to the present invention.
Figure 2D:
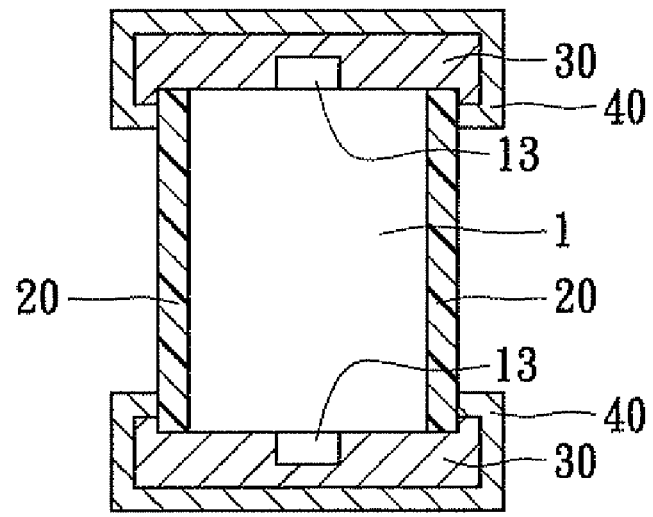
FIG. 2D is a structural diagram showing the step of forming connecting layer on the single chip semiconductor according to the present invention.

Please refer to FIGS. 1 and 2D; the present invention provides a single chip semiconductor coating structure and the manufacturing method thereof. The manufactured device with the single chip semiconductor coating structure is connected electrically to PCB without wire-bonding. In other words, the connecting process is more simplified. Please refer to FIGS. 2 to 2C; the manufacturing method includes the following steps:

Step (S101) is providing a single chip semiconductor 1, as shown in FIG. 1A. In the embodiment, the single chip semiconductor 1 is a hexahedron and has three groups of opposite surfaces. The three groups of opposite surfaces are the first group of opposite surfaces 10 (i.e., the right and the left surfaces), the second group of opposite surfaces 11 (i.e., the front and the rear surfaces), and the third group of opposite surfaces 12 (i.e., the top and the bottom surfaces). One of the three groups of opposite surfaces performs as the manufacturing surfaces of wafer (for example, silicon wafer) and the manufacturing surfaces are manufactured by photolithography, thin film deposition, etching, doping methods and so on. Two opposite surfaces of the selected group of the three groups have a conductive area 120 thereon, respectively. Each conductive area 120 has a pad 13. In the embodiment, the third group of opposite surfaces 12 (i.e., the top and the bottom surfaces) has a conductive area 120 thereon and the pad 13 is formed on the conductive area 120 of the top surface and the bottom surface. However, the single chip semiconductor 1 can have various shape and type.

On the other hand, the dimension of the single chip semiconductor 1 is, but not restricted to 0.6 mm×0.3 mm×0.5 mm or 1.0 mm×0.5 mm×0.5 mm or 1.6 mm×0.8 mm×0.5 mm.

As shown in FIG. 2, step (S103) is providing a tool 200 to cover one of the conductive areas 120 with the pad 13. The single chip semiconductor 1 is assembled on the tool 200 so that one manufacturing surface of the opposite surfaces is covered by the tool 200. In the embodiment, the tool 200 is used for covering the conductive area 120 with the pad 13 of the top surface. Therefore, the conductive area 120 with the pad 13 of the top surface is prevented from the influence of the following processes.

As shown in FIG. 2A, step (S105) is providing a coating step. An insulating layer 20 is formed on the single chip semiconductor 1. In other words, the rest surfaces of the single chip semiconductor 1 are cover by the insulating layer 20, except the surface covered by the tool 200. In the embodiment, the single chip semiconductor 1 with the tool 200 is put into a film-coater to form the insulating layer 20 on the surfaces of the single chip semiconductor 1 (except the top surface which is covered by the tool 200). The insulating layer 20 can be made of organic polymer, silicon oxide or polysilicon. On the other hand, the insulating layer 20 has thickness of 1 um to 50 um, but not restricted to, for protecting the single chip semiconductor 1.

In addition, the tool 200 is released form the single chip semiconductor 1 after the coating step.

Please refer to FIG. 2B; step (S107) is providing a removing step to remove the insulating layer 20 for exposing the covered conductive area 120 and the pad 13. In the step, partial insulating layer 20 is removed for exposing the covered conductive area 120 and the pad 13. In the embodiment, the insulating layer 20 on the bottom surface of the single chip semiconductor 1 is removed so as to expose the conductive area 120 and the pad 13 of the bottom surface of the single chip semiconductor 1.

Alternatively, the tool 200 can be released form the single chip semiconductor 1 after the step of removing the insulating layer 20. The sequence of the two steps can be adjusted depending on the application.

Please refer to FIG. 2C; step (S109) is forming two electrodes 30. The exposed two ends (the top and the bottom surfaces) of the single chip semiconductor 1 are coated by materials of silver or copper so as to form a conductive layers thereon (i.e., the electrodes 30) in the step. In the embodiment, silver glue is coated on the third group of opposite surfaces 12 (i.e., the top and the bottom surfaces). Then, processes of drying, curing and/or firing are provided for forming the electrodes 30. The formed electrodes 30 cover and contact the pads 13 of the third group of opposite surfaces 12 (i.e., the top and the bottom surfaces) and perform as the connecting-paths.

Furthermore, the two ends of each electrode 30 extends on the insulating layer 20, but not restricted thereby.

Please refer to FIG. 2D; a step of forming a connecting layer 40 is provided after the step of forming two electrodes 30. The connecting layer 40 is formed on the electrode 30. In the embodiment, the connecting layer 40 is formed by an electroplating method, for example, Ni/Sn-included materials, on the two electrodes 30. Moreover, two ends of the connecting layer 40 can extend on the insulating layer 20, but not restricted thereby. The connecting layer 40 has property of weldability and can be a welding interface. Therefore, the single chip semiconductor 1 can be welded on circuits of a PCB via the connecting layer 40.

Thereafter, the single chip semiconductor 1 having a coating structure and a weldable structure is provided. The single chip semiconductor 1 has a plurality group of opposite surfaces. Two opposite surfaces selected from the plurality of opposite surfaces are defined as manufacturing surfaces which have a conductive area 120 with a pad 13 thereon, respectively. In other words, a pad 13 is disposed on one conductive area 120. An insulating layer 20 is coated on the rest surfaces of the plurality of surfaces (i.e., the surfaces without conductive area 120 thereon). On the other hand, two electrodes 30 cover on the conductive area 120 with a pad 13 of the two opposite surfaces which are exposed from the insulating layer 20. Moreover, a connecting layer 40 is formed on the electrode 30 so that the single chip semiconductor 1 can be welded on circuits of a PCB via the connecting layer 40. To sum up, the non-conductive surfaces (i.e., the surfaces without the pad 13) are coated by insulating layer 20 and the conductive surfaces (i.e., the surfaces with the pad 13) are provided with the electrode 30 and the connecting layer 40.

Figure 3:
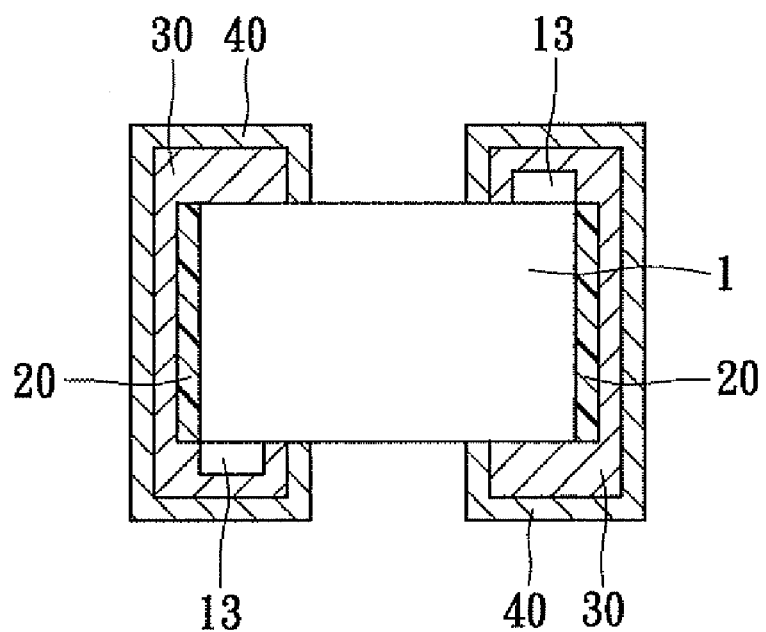
FIG. 3 is a structural diagram of the single chip semiconductor coating structure of the second embodiment according to the present invention.

On the other hand, the positions of the two pads 13 can be aligned to each other. As shown in FIG. 2D, the two pads 13 are respectively disposed on the center of the top surface and the bottom surface of the single chip semiconductor 1. In the embodiment, the top surface and the bottom surface are manufacturing surfaces of the silicon wafer. FIG. 3 shows another embodiment. Similarly to the first embodiment, the two pads 13 are respectively disposed on the top surface and the bottom surface of the single chip semiconductor 1, which are manufacturing surfaces of the silicon wafer. However, the positions of the pads 13 are misaligned to each other. In other words, each pad 13 is disposed on an edge of the corresponding surface. For example, the pad 13 on the top surface of the single chip semiconductor 1 is disposed near the right edge of the top surface of the single chip semiconductor 1. On contrary, the pad 13 on the bottom surface of the single chip semiconductor 1 is disposed near the left edge of the top surface of the single chip semiconductor 1. Therefore, the manufacturing method can be applied to the devices of various types so as to simplify the procedures of the device package.

In summary, the present invention has the following advantages.

1. The single chip semiconductor coating structure is provided on a single chip semiconductor so that the single chip semiconductor is coated by electrodes and weldable connecting layer. Thus, the single chip semiconductor with the coating structure can be directly welded on the PCB without the traditional attaching-chip, wire-bonding and packaging processes. Accordingly, the back-end manufacturing process is simplified.

2. The insulating layer, the electrodes and the connecting layer are provided for protecting the single chip semiconductor from the particles, such as dust or steam. Thus, the reliability of the single chip semiconductor coated by the coating structure of the present invention is increased.

The above-mentioned descriptions represent merely the preferred embodiment of the present invention, without any intention to limit the scope of the present invention thereto. Various equivalent changes, alternations, or modifications based on the claims of present invention are all consequently viewed as being embraced by the scope of the present invention.

What is claimed is:

1. A single chip semiconductor coating structure, comprising:
    a single chip semiconductor having a plurality of surfaces, wherein two opposite surfaces are selected from the plurality of surfaces as manufacturing surfaces, wherein each manufacturing surface includes a conductive area with a pad disposed thereon;
    an insulating layer coated on the plurality of surfaces of the chip semiconductor except for the manufacturing surfaces; and
    a positive electrode and a negative electrodes disposed on the manufacturing surfaces,
        wherein each of the electrodes extends across at least one surface of the chip,
        wherein each of the electrodes is respectively formed on the conductive area and embeddingly covering the pad,
        wherein each of the two electrodes has two ends extending onto and partially overlaps the insulating layer.

2. The single chip semiconductor coating structure according to claim 1, further comprising a connecting layer with weldability coveringly disposed on the electrodes.

3. The single chip semiconductor coating structure according to claim 2, wherein the connecting layer is formed by an electroplating method and two ends of the connecting layer extend on the insulating layer.

4. The single chip semiconductor coating structure according to claim 3, wherein the connecting layer has a component of nickel or a component of tin.

5. The single chip semiconductor coating structure according to claim 1, wherein positions of the pads are non-symmetrical with respect to each other.

6. The single chip semiconductor coating structure according to claim 5, wherein each pad is disposed on an edge of the corresponding surface.

7. The single chip semiconductor coating structure according to claim 1, wherein each of the two electrodes has a component of silver or a component of copper.

* * * * *